United States Patent [19]  [11] Patent Number: 4,699,888
Dumesnil et al.  [45] Date of Patent: Oct. 13, 1987

[54] DIE/ATTACH COMPOSITION

[75] Inventors: Maurice E. Dumesnil, Los Altos Hills, Calif.; Karl Starz, Rodenbach, Fed. Rep. of Germany; Leonid Finkelshteyn, San Francisco, Calif.

[73] Assignee: Technology Glass Corporation, Union City, Calif.

[21] Appl. No.: 776,610

[22] Filed: Sep. 16, 1985

[51] Int. Cl.$^4$ .............................................. C03C 8/18
[52] U.S. Cl. ..................... 501/19; 106/114; 252/514
[58] Field of Search .......... 501/19; 106/1.14; 252/514

[56] References Cited

U.S. PATENT DOCUMENTS

| | | | |
|---|---|---|---|
| 2,530,217 | 11/1950 | Bain | 501/19 |
| 3,154,503 | 10/1964 | Janakirama-Rao et al. | 501/19 |
| 4,002,799 | 1/1977 | Dumesnil et al. | 501/76 |
| 4,186,023 | 1/1980 | Dumesnil et al. | 501/15 |
| 4,251,595 | 2/1981 | Dumesnil et al. | 501/22 |
| 4,401,767 | 8/1983 | Dietz et al. | 501/19 |
| 4,476,090 | 10/1984 | Heidsiek et al. | 501/19 |

OTHER PUBLICATIONS

Moghadam, F. K. "Development of Adhesive Die Attach Technology in Cerdip Packages; Material Issues'-'-Proceedings of the 1983 ISHM International Microelectronics Symposium, Oct. 31–Nov. 2, 1983, Phila., Pa.-9 pages.

*Primary Examiner*—William R. Dixon, Jr.
*Assistant Examiner*—Steven Capella
*Attorney, Agent, or Firm*—Limbach, Limbach & Sutton

[57] ABSTRACT

A silver-glass composition for use in attaching a semiconductor support and a method for making the attachment are disclosed. The glass component of the composition is a low melting point glass comprising about 75–85 wt. % lead oxide, about 8–15% boron oxide, about 0.75 to 2.5 wt. % silicon-dioxide, 0–10 wt. % zinc oxide, 0 to 3 wt. % alumina, 0.5 to 5.5 wt. % cuprousoxide and a non-volatile metal fluoride in amount such that the mol ratio of cuprous oxide to the fluoride content of the metal fluoride is in the range 1.0:0.25 to 1.0:10. The weight ratio of silver to glass in the composition is in the range about 2:1 to 9:1.

1 Claim, No Drawings

DIE/ATTACH COMPOSITION

BACKGROUND OF THE INVENTION

The present invention relates to a die/attach composition consisting essentially of a silver filled glass which is slurried in an organic vehicle to form a paste which is applied to the surface of a ceramic support for a semiconductor device. The semi-conductor device is laid down on the paste coated surface of the support and the assembly is dried to remove organic vehicle and then fired to remove all residue of the vehicle from the assembly.

Considerable effort has been exerted over a long period of time to improve the strength of the bond between semiconductor devices and ceramic supports. A recent and extensive review of the development of die/attach compositions has been reported by F. K. Moghadam and published in the proceedings of the 1983 ISHN International Microelectronics Symposium, Oct. 31 - Nov. 2, 1983, Philadelphia, Pa., entitled "Development of Adhesive Die/Attach Technology in Cerdip Packages; Material Issues". Moghadam reports an inorganic die/attach paste manufactured by Johnson Matthey Inc. which in the wet form contains 66.4% silver, 16.6% glass, 1% resin and 16% solvent, which after drying and organic burn-out would be completely inorganic with 80% silver and 20% glass. This paste is identified by the manufacturer as JMI-4613.

U.S. Pat. No. 4,401,767 assigned to Johnson Matthey Inc. and titled, "Silver-Filled Glass", appears to describe the inorganic die/attach paste discussed by Moghadam.

The present invention is directed to a silver-filled glass die/attach composition which is a significant improvement over the silver-filled glass composition described by Moghadam and by the U.S. Pat. No. 4,401,767.

BRIEF DESCRIPTION OF THE INVENTION

The silver-filled glass of the present invention consists essentially of a mixture of a major proportion of powdered silver and a minor proportion of powdered glass.

The powdered silver may be either spherical or flake powder or mixtures of the two having surface areas from about 0.3 to 1.3 square meters per gram and tap densities from about 2.4 to 3.4 grams per cubic centimeter.

The powdered glass has the following composition range: a lead oxide 75-85 wt. %, boron oxide 8-15 wt. %, silicon dioxide 0.75 to 2.5 wt %, bismuth oxide 1 to 5 wt %, cuprous oxide 0.5 to 5.5 wt %, non-volatile metal fluoride in amount such that the mol ratio of cuprous oxide to the fluoride content of the metal fluoride is in the range 1:0.25 to 1:10, zinc oxide 0 to 10 wt %, preferably below 8 wt %, and alumina 0-3 wt %. The metal flouride is preferably the fluoride of one or more of the metals of the oxide components of the glass, i.e. lead fluoride, cuprous fluoride or zinc fluoride.

These silver filled glasses are markedly superior to silver filled glasses currently used for bonding semiconductor devices to ceramic supports.

DETAILED DESCRIPTION OF THE INVENTION

The silver-filled glasses of the invention are intimate mixtures of powdered silver metal and powdered glass.

The character of the silver metal powder has been described above and the composition of the glasses has been generally described above.

Specific glass compositions suitable for use in the invention are disclosed in Dumesnil U.S. Pat. Nos. 4,186,023 and 4,251,595.

Examples 1 through 10 of U.S. Pat. No. 4,186,023 give the compositions of glasses suitable for use in the invention, and Examples 1 and 2 of U.S. Pat. No. 4,251,595 give compositions of additional glasses useful in the composition of the invention. These patents are incorporated herein by reference.

Powdered silver constitutes a major component and powdered glass the minor component of the compositions of the invention. The weight ratio of silver to glass is in the range 2:1 to 9:1, preferably about 3:1 to 5:1 and optimally about 4:1. All of the glasses employed are nondevitrifying glasses in the sense that devitrification does not occur when the glasses are exposed to a temperature of 430° C. for a period of 15 minutes.

In order to apply the silver-filled glasses to the surface of a ceramic support, a mixture of silver powder and glass powder is slurried in an organic vehicle which boils below about 265° C. Suitable vehicles are terpineol, carbitol acetate, ester alcohols such as 2,2,4-3 methyl pentanediol-1,3 -monoisobutyrate sold by EASTMAN under the trade name TEXANOL and butyl carbitol or mixtures of these materials. Other organic liquids boiling above about 100° C. and below about 265° C. may be employed.

A resin which decomposes below the softening point of the glass, i.e., below about 280° C. is dissolved in the organic vehicle in a small amount, usually about 1 to 10% by weight. Suitable resins are nitrocellulose, used at about 1 to 2% by weight or ethyl or butyl methacrylate used at about 6 to 10% by weight. The resins increase the viscosity of the organic vehicle and impede the settling of the finely divided silver and glass particles from the slurry. Ethyl methacrylate resin sold by Rohm and Haas under the trade name Acryloid B72 is an especially suitable resin. The slurry has a general appearance of a paste and is frequently referred to as a paste.

In using the paste to attach a die to a ceramic surface, a small amount of the paste is applied via a syringe to the surface of the ceramic support. The wet paste is in the form of a small dome when it is deposited on the ceramic support and the semiconductor device is pressed down into the dome of paste. The resulting assembly is then carefully dried at about 75 to 150° C. for a time sufficient to evaporate substantially all of the vehicle and is then fired at a temperature below about 400° C., preferably at about 380° C. to completely drive off any residual solvent and to completely decompose the resin which was dissolved in it. After the firing step the semiconductor device is strongly bonded to the supporting ceramic.

The silver-filled glass is ordinarily supplied to the user in paste form and applied by the user in that form. However, the silver-filled glass may be given to the user as a dry powder and the user can add the organic vehicle at the time use of the material is intended.

The user may also be supplied with a ceramic support precoated with the paste. The coated ceramic is prepared by laying down a thick film of paste on the ceramic and drying it to the point where it is moderately tacky. In this form it may be supplied to the user who can then apply the semiconductor device to the surface of the coated ceramic support.

EXAMPLE I

A representative preparation of a silver- filled glass paste is carried out as follows. The following powders:

- 415 grams lead oxide
- 30 grams lead fluoride
- 30 grams zinc oxide
- 80 grams boric acid
- 5 grams silica
- 12 grams cuprous oxide
- 8 grams bismuth oxide
- 10 grams aluminum hydroxide These powders were intimately mixed and then heated in a platinum crucible at 1100° C. for 30 minutes until a homogeneous melt was formed. During the heating the boric acid was converted to boron oxide and the aluminum hydroxide was converted to aluminum oxide. The melt was then poured through cold stainless steel rollers and the resulting glass flakes were crushed to a fine powder in a ceramic roll mill. 20 grams of the finely powdered glass were mixed dry with 80 grams of silver powder (density 3 grams per cubic centimeter, surface area 1 square meter per gram). 30 grams of a solution composed of 1% by weight of nitrocellulose (molecular weight 2,000) in butyl carbitol were added to the silver glass powder mixture and thoroughly roll milled to produce a paste.

A similar paste was prepared using the silver-filled glass which is commercially available as JMI-4613. The proportions of silver and glass were the same as in the above preparation of the paste of the invention and the same solution in the same amount was employed to make the paste. Both pastes were then used to attach semiconductor devices of the same size and composition to ceramic supports having several different surface coatings. The attachment of the semiconductor device to the ceramic supports were made at two firing temperatures, i.e., 380° C. and 430° C. The strength of the bonds between the semiconductor devices and the ceramic support were then determined by stud pull test. The results of this testing are shown in the following table.

COMPARATIVE STUD PULL TEST

| Surface Coating of die | Commercial Die Attach Composition Firing Temperature | | Die Attach Composition of Example I Firing Temperature | |
|---|---|---|---|---|
| | 380° C. | 430° C | 380° C. | 430° C. |
| Backside coated with Silicon Dioxide | 1.8 KPSI | 2.9 KPSI | 2.8 KPSI | 3.0 KPSI |
| Backside coated with Cr/Au Evaporated | 0.4 KPSI | 0.8 KPSI | 2.8 KPSI | 2.9 KPSI |
| Backside coated with Cr/Au Sputtered | 1.0 KPSI | 1.5 KPSI | 2.9 KPSI | 3.1 KPSI |
| Backside coated with Al₂O₃ | 1.9 KPSI | 3.5 KPSI | 3.5 KPSI | 3.5 KPSI |

The ceramic support is composed mainly of alumina (92%) and contains minor amounts (about 2% each) of $SiO_2$, $TiO_2$, MnO and $Fe_2O_3$. The thickness of the bonding layer of silver-filled glass between the surface of the ceramic support and the semiconductor device is in the range 2-2.5 mils.

It is apparent from the table that the bond strength obtained using the composition of the invention and the firing temperature of 380° C. is equal to or greater than the bond strength obtained with the commercial die attached composition using a firing temperature of 430° C. It is also apparent that using the die attach composition of the invention that the strength of the bond obtained at a 380° C. firing temperature is equal to or almost equal to that which can be obtained using 430° C. firing temperature.

It is also apparent from the table that the bond strength obtained with the commercial composition using a firing temperature of 380° C. were inadequately weak.

It is also apparent from the table that where the ceramic had a gold backing the bond strength obtained with the composition of the invention with a temperature of 380° C. was twice as great as the bond strength obtained with the commercial composition at a firing temperature of 430° C.

The importance of obtaining a strong bond at low temperatures is great. Thermal stresses between the semiconductor (die) and the ceramic support are lower at lower firing temperatures and significant reduction in die off and die crack problems are obtained when lower firing temperatures are employed. These problems have increasing importance when the semiconductor device is large and when the ceramic support is gold backed. The gold backings are commonly underlaid with a nickel coating and a nickel diffusion into the gold occurs at higher temperatures, e.g., 430° C.

We claim:

1. A composition for use in bonding a semiconductor device to a ceramic support comprising a mixture of:
    (a) powdered silver metal;
    (b) powdered low melting glass consisting essentially of about 75-85 wt. % lead oxide, about 8-15 wt. % boron oxide, about 0.75 to 2.5 wt. % silicon dioxide, 0 to 10 wt. % zinc oxide, 0-5 wt. % bismuth oxide, 0 to 3 wt. % alumina, 0.5 to 5.5 wt. % cuprous oxide and a non-volatile metal fluoride in amount such that the mol ratio of cuprous oxide to the fluoride content of the metal fluoride is in the range of 1.0:0.25 to 1.0:10, and having a DTA softening point in the range about 260° C.-280° C., the weight ratio of (a) to (b) being in the range about 2:1 to 9:1.

* * * * *

UNITED STATES PATENT AND TRADEMARK OFFICE
CERTIFICATE OF CORRECTION

PATENT NO. : 4,699,888
DATED : October 13, 1987
INVENTOR(S) : Dumesnil et al

It is certified that error appears in the above-identified patent and that said Letters Patent is hereby corrected as shown below:

Title page:

Item [73]  Assignee:   "Technology Glass Corporation"

should read

--Degussa Electronics Inc.--.

Signed and Sealed this

Seventeenth Day of May, 1988

Attest:

DONALD J. QUIGG

Attesting Officer

Commissioner of Patents and Trademarks